United States Patent [19]

Deckert et al.

[11] 4,237,379
[45] Dec. 2, 1980

[54] METHOD FOR INSPECTING ELECTRICAL DEVICES
[75] Inventors: Cheryl A. Deckert, Lawrenceville; Robert B. Comizzoli, Belle Mead, both of N.J.; George L. Schnable, Lansdale, Pa.
[73] Assignee: RCA Corporation, New York, N.Y.
[21] Appl. No.: 51,168
[22] Filed: Jun. 22, 1979
[51] Int. Cl.³ .............................................. G09K 3/00
[52] U.S. Cl. .............................. 250/302; 250/461R; 324/54; 324/158 R; 357/52
[58] Field of Search .............. 324/54, 158 T, 158 D, 324/158 R; 250/302, 492 A, 492 R, 461; 357/52

[56] References Cited

U.S. PATENT DOCUMENTS

| | | | |
|---|---|---|---|
| 2,472,522 | 6/1949 | deForest | 250/302 |
| 3,465,150 | 9/1969 | Hugle | 250/492 A |
| 3,490,873 | 1/1970 | Corl | 23/230 |
| 3,567,932 | 3/1971 | Alburger | 73/104 |
| 3,750,018 | 7/1973 | Leone et al. | 324/54 |

OTHER PUBLICATIONS

"Dye Lasers" by F. P. Schafer, pp. 164–166, published in Topics in Applied Physics, vol. #1.

Primary Examiner—Harold A. Dixon
Attorney, Agent, or Firm—Birgit E. Morris; Donald S. Cohen; Thomas H. Magee

[57] ABSTRACT

A method of inspecting electrical devices such as integrated circuit devices which have conductors covered by a protective layer of passivating material to determine the quality of the protective layer includes treating the circuit with a fluorescein containing dye and exposing the treated device to UV radiation while applying a voltage between two conductors. Fluorescence is observable in well passivated areas of the device but not in unpassivated or inadequately passivated areas. When a device is tested before dicing from a wafer, adjacent devices to which no voltage is applied fluoresce in both passivated and unpassivated areas.

10 Claims, 2 Drawing Figures

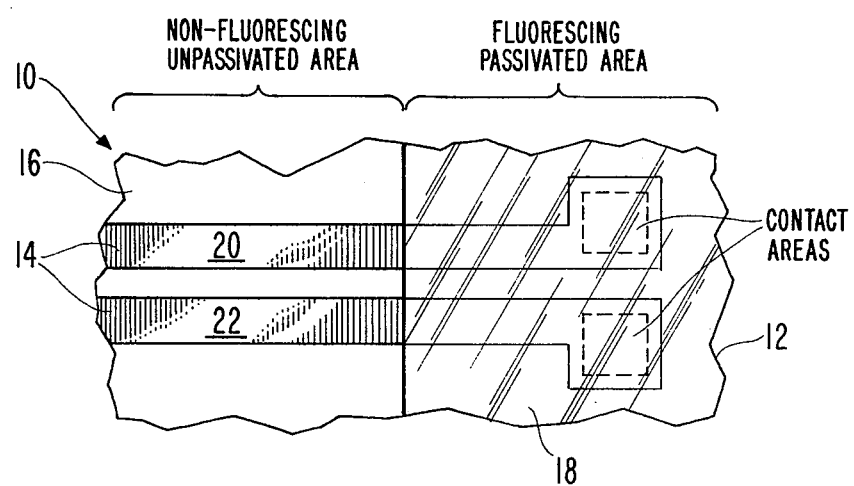

METHOD FOR INSPECTING ELECTRICAL DEVICES

The Government has rights in this invention pursuant to contract No. F30602-78-C-0276 awarded by the Department of the Air Force.

BACKGROUND OF THE INVENTION

This invention relates to a method for inspecting electrical devices which have conductors covered by one or more protective layers of insulating material, to determine the quality of the protective layer or layers.

Effective inspection of electrical devices such as monolithic integrated circuit devices or other electrical or electronic devices such as hybrid integrated circuit devices, thin or thick film integrated circuit devices, and printed circuit boards, which are provided with a protective layer of insulating or passivating material over the conductors thereof, is indispensable to the production of reliable products. Careful inspection of monolithic integrated circuit devices, for example, is preferably carried out in an early stage of their production and particularly before they are diced and mounted. The early detection of unacceptable devices can result in significant savings in the cost of production. Visual inspection of integrated circuit devices is carried out at several stages in the production process, but visual inspection cannot effectively detect flaws in protective passivating material, particularly when the flaw occurs over a non-specular surface such as that of an aluminum conductor.

SUMMARY OF THE INVENTION

The present invention makes use of a fluorescent dye such as fluorescein which can be applied as a coating to an electrical device to be inspected. A voltage is applied between two conductors in the device, and simultaneously, the device is exposed to actinic radiation. Under these conditions, the dye fluoresces wherever the protective layer is present and is of good quality but not where the protective layer is absent or is of poor quality. Inadequately passivated devices are thereby easily revealed.

DETAILED DESCRIPTION OF THE INVENTION

Figure 1:
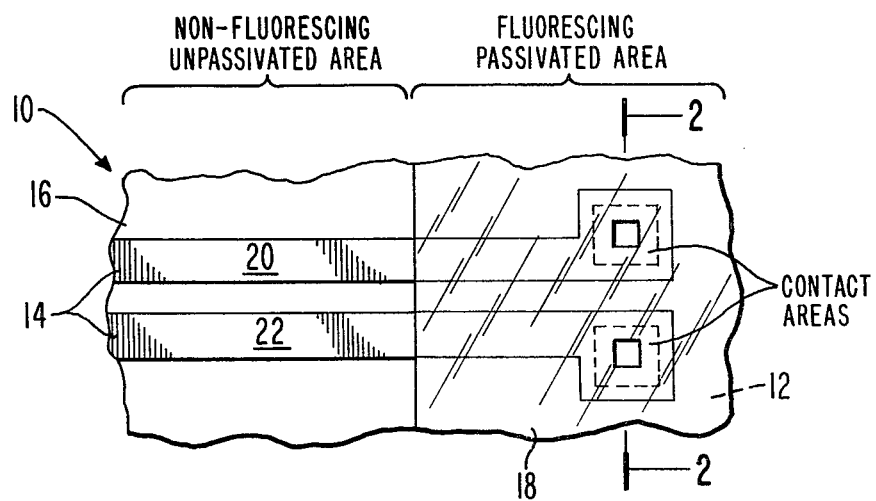
FIG. 1 is a plan view showing one embodiment of a metallized substrate.

Referring to FIG. 1 of the drawing there is shown one embodiment of a metallized substrate comprising a monolithic integrated circuit (IC) device 10.

For convenience, the present method will be described with reference to the testing of monolithic integrated circuit devices, such as the monolithic IC device 10. These devices are ordinarily made by batch process in which many devices are made simultaneously on a wafer 12 of semiconductor material. Circuit elements within the device 10 are interconnected by patterns 14 of conductive material deposited over a layer 16 of insulating material, and, in most cases, the conductive material is protected by a layer 18 of a passivating material such as chemical-vapor-deposited (CVD) silicon dioxide. The protection afforded by the passivation material is both mechanical and chemical. The coating protects the conductors from mechanical damage due to scratching, for example, and acts as a barrier to exclude corroding agents such as water vapor. Passivation layers of good quality are necessary for reliable products.

Figure 2:
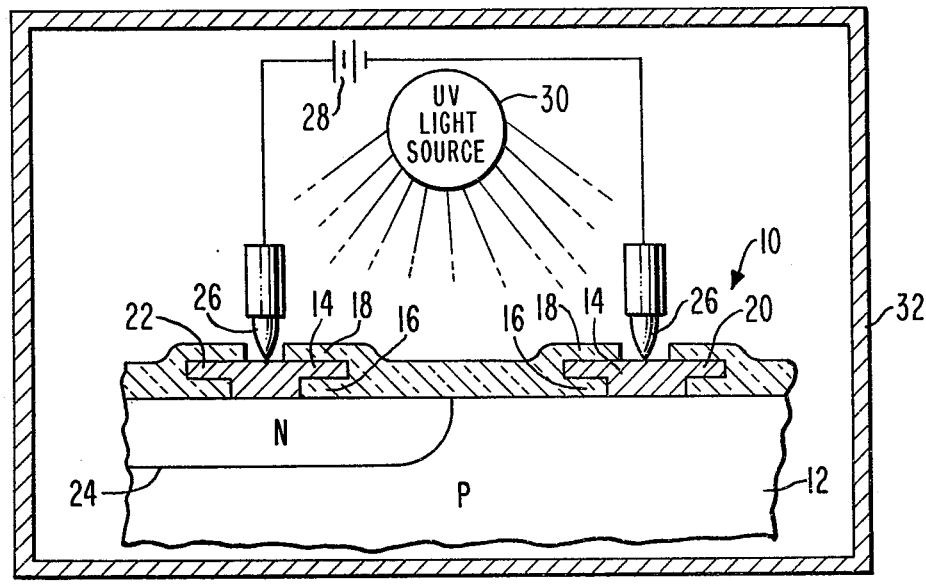
FIG. 2 is a cross-sectional view taken along line 2-2 of FIG. 1.

We have discovered that the quality of the passivation layer 18 on the integrated circuit device 10 can be visually revealed by coating the device 10 with a fluorescent dye and then exposing the device 10 to actinic radiation, while simultaneously applying a voltage between two conductors in the device 10. The selected conductors 20 and 22 should lie close to each other and the voltage should be large enough to produce a relatively strong electric field. About 12 volts has been found to be sufficient. The polarity of the applied voltage is not critical except when the device 10 under test is a monolithic integrated circuit in which essentially all conductors are connected via at least one PN junction 24,00 shown in FIG. 2. In this case, the proper polarity is applied to reverse bias the connecting junction 24. The bias may be applied simply by engaging contact probes 26 with the two selected conductors 20 and 22 of the device 10 at bond pads of the device 10, as shown in FIG. 2. The probes 26 are connected to a source 28 of potential which preferably comprises a DC voltage source of approximately 12 volts. During the application of the bias voltage, the fluorescent dye is exposed to actinic radiation. In the present embodiment, the IC device 10 is irradiated by a source 30 of ultraviolet (UV) light. Broadly, our method comprises applying a coating of a fluorescent dye solution to the surface of the passivation layer 18 of a device, applying a bias voltage to two selected conductors 20 and 22, and then exposing the device 10 to actinic radiation. Preferably, the biasing and radiating steps are carried out in an atmosphere of controlled humidity, illustrated in FIG. 2 as an enclosure 32 within which the biasing and radiating steps are carried out. The relative humidity of the testing atmosphere must be between about 0% and about 70%. The method appears to be inoperative at higher relative humidities.

We have found that fluorescein is an effective substance for use in the present method. Not all fluorescein solutions are acceptable, however. Fluorescein in water/ethanol, for example, is unsatisfactory. After this solution has dried, the dye does not fluoresce. An effective dye solution, however, is one which contains a small amount of a nonvolatile solvent such as glycerol in an excess of ethanol. The concentration of glycerol in the solution must be kept relatively low. A solution having a concentration greater than about 1% glycerol, by volume, in ethanol will not dry sufficiently after its application. Glycerol concentrations less than 1 volume % are satisfactory, and we prefer to use a concentration between about 0.2 volume % and about 1 volume % glycerol. The fluorescein concentration in this solution may be between about 0.3 and about 0.6 grams/liter.

When glycerol is chosen as the nonvolatile solvent, a surfactant should be added to the solution. Glycerol has a very high surface tension and does not flow well over the surface of a device to form a uniform film. Adding a surfactant to the dye solution eliminates this problem. Any compatible surfactant may be used except that the effective concentration of the surfactant may be different for different materials.

EXAMPLE

The following is an example of one specific embodiment of the above-described method.

The device tested in this example is a monolithic semiconductor device, still part of a wafer containing many other devices, which has a gold-containing metallization pattern over a silicon dioxide insulating layer on the surface of the semiconductive body of the device. The metallization layer is covered with a passivation glass, particularly a CVD silicon dioxide layer.

The quantity of dye solution is first applied to the surface of the device. Preferably this is done in a conventional wafer spinning apparatus in order to form a uniform film of the dye solution. The dye solution had the following composition. The carrier was ethanol containing about 1 volume % glycerol. The surfactant in the solution was one identified by the trade designation FC-93 which is available from the 3M Company, Minneapolis, Minnesota. The concentration of the surfactant in the solution was about 0.1%, by volume. The solution contained fluorescein at a concentration of about 0.6 grams/liter.

After applying the dye solution, the device is allowed to dry partially, complete drying being prevented by the glycerol. The dye coated wafer is then placed in a nitrogen atmosphere maintained at about 20% relative humidity, and probes are engaged with two selected conductors of the device at bond pads of the device. A DC bias voltage of about 12 volts is then applied, with the proper polarity. During the application of the bias voltage, the device is irradiated with ultraviolet light. Fluorescence is observed in those areas of the device in which the passivation layer is of good quality but not in any areas which have inadvertently remained unpassivated or where the passivation is inadequate. Surrounding devices in a wafer, to which no voltage is applied, exhibit fluorescence in both well passivated and poorly passivated areas.

The reason for the fluorescence action described here is not completely known, but we think that it may be related to variations in the local surface pH of the device under test. Fluorescein exhibits green fluorescence at pH values greater than 4.5. Apparently, lower pH (less than 4.5) is induced at unpassivated or inadequately passivated areas across which a voltage is applied but not at well passivated areas.

What is claimed is:

1. A method for inspecting an electrical device, which has conductors covered by a protective layer of passivating material, to determine the quality of said protective layer comprising the steps of
    coating said device with fluorescent dye,
    applying electrical energy to two conductors of said device, and
    exposing said fluorescent dye to actinic radiation.

2. A method as defined in claim 1 applied to a monolithic integrated circuit device in which said two conductors are connected via at least one PN junction, in which
    the electrical energy is supplied by a DC voltage, the polarity of which reverse biases said PN junction.

3. A method as defined in claim 1 wherein said fluorescent dye contains fluorescein.

4. A method as defined in claim 1 further comprising carrying out said applying and exposing steps in an atmosphere of controlled relative humidity between about 0% and about 70%.

5. A method as defined in claim 1 wherein said fluorescent dye comprises fluorescein and a nonvolatile solvent.

6. A method as defined in claim 5 wherein said fluorescent dye further comprises a surfactant.

7. A method as defined in claim 6 wherein said nonvolatile solvent comprises glycerol in an excess of ethanol.

8. A method as defined in claim 7 wherein the concentration of glycerol in the ethanol is between about 0.2 volume % and about 1.0 volume %.

9. A method as defined in claim 7 wherein the concentration of glycerol in the ethanol is about 1.0 volume %.

10. A method as defined in claim 9 wherein the amount of fluorescein in said dye is about 0.6 grams/liter.

* * * * *